US005804516A

United States Patent [19]

Hsu et al.

[11] Patent Number: 5,804,516

[45] Date of Patent: Sep. 8, 1998

[54] WET PROCESSING TANK EQUIPPED WITH RAPID DRAIN AND RINSE SYSTEM

[75] Inventors: Y. M. Hsu, Hsin-Chu; C. J. Pang, Hu-KoShan, both of Taiwan

[73] Assignee: Taiwan Semiconductor Manufacturing Co. Ltd., Hsin-Chu, Taiwan

[21] Appl. No.: 663,633

[22] Filed: Jun. 14, 1996

[51] Int. Cl.[6] .................................................... H01L 21/00

[52] U.S. Cl. ............................ 438/745; 156/345; 216/93; 438/753

[58] Field of Search ........................ 152/345 L; 438/745, 438/753; 216/93

[56] References Cited

U.S. PATENT DOCUMENTS

| | | | |
|---|---|---|---|
| 4,822,441 | 4/1989 | Ohta et al. | 156/345 |
| 5,571,367 | 11/1996 | Nakajim et al. | 156/345 |

*Primary Examiner*—William Powell
*Attorney, Agent, or Firm*—Tung & Associates

[57] ABSTRACT

In accordance with the present invention, a wet bench processing apparatus equipped with a rapid drain and rinse system is provided. The system stores reserved liquids and air pressure during normal operation for use during a situation where a power or mechanical failure may occur. When such a failure occurs, a controller unit, which is connected to an uninterrupted power supply or other types of energy storage devices, provides an electrical control signal to a solenoid actuated valve. The solenoid actuated valve receives a pneumatic input that is received from a pressurized air reservoir. When the electrical signal is received by the solenoid actuated valve, the reserved pneumatic pressure is released to operate one or more valves. A reservoir of rinse fluid is provided such that when one of the valves is activated by the solenoid actuated valve, gravity forces rinse fluid through the valve and into the tank to remove the chemicals from the wafers.

20 Claims, 2 Drawing Sheets

WET PROCESSING TANK EQUIPPED WITH RAPID DRAIN AND RINSE SYSTEM

FIELD OF THE INVENTION

The present invention generally relates to a wet bench system for semiconductor processing and more particularly, to a wet bench system for semiconductor processing that is equipped with a quick drain and rinse system to avoid wafer scraps caused by excessive immersion time.

BACKGROUND OF THE INVENTION

Semiconductor processing and manufacturing generally requires numerous manufacturing steps to produce a desired integrated circuit chip. The numerous steps may include etching, photoresist stripping and prediffusion cleaning Since the chemicals used in these steps are often quite toxic to humans (e.g., strong acids, alkalis, or volatile solvents), care must be taken to minimize the risk of exposure to the plant personnel working in the manufacturing facility.

One conventional method for exposing semiconductor wafers to the chemicals necessary for the various manufacturing steps is to provide a series of tanks each filled with a particular chemical. The wafer is loaded into a particular tank containing a particular chemical for a predetermined time after which some a mechanical wafer handling system, such as a robotic arm, removes the wafers from the particular tank. The mechanical wafer handling system then places the wafer into one or more additional tanks to complete the chip fabrication process.

Since the mechanical wafer handling system, such as the robotic arm, is a fairly complicated device, occasional failure may be expected. The electrical power supply to the robotic arm, despite redundant power supplies, may under certain circumstances be expected to fail. If such a mechanical or electrical failure occurs during a key processing step, such as an etching step where the control of etching time is critical, the wafers may be permanently damaged and have to be scraped.

It is therefore an object of the present invention to provide a wet processing tank for wafers equipped with a rapid drain and rinse system so that the tank can be rapidly drained and the wafers can be rapidly rinsed.

It is another object of the present invention to provide a wet processing tank for wafers equipped with a rapid drain and rinse system that functions during an electrical power failure.

It is a further object of the present invention to provide a wet processing tank for wafers equipped with a rapid drain and rinse system that can be used to avoid the excessive emersion of wafers in the event of a power failure during a processing step and also to periodically change the processing fluids in a wet bench system.

It is another further object of the present invention to provide a wet processing tank for wafers equipped with a rapid drain and rinse system that can be operated during a power or mechanical failure and can provide a display of the final emersion time when such power or mechanical failure occurs.

It is yet another object of the present invention to provide a wet processing tank for wafers equipped with a rapid drain and rinse system that can be activated automatically when a predetermined time is lapsed after a mechanical or electrical failure.

SUMMARY OF THE INVENTION

In accordance with the present invention, a wet processing tank for wafers equipped with a rapid drain and rinse system is provided. The system stores reserved liquids and air pressure during normal operation for use in a situation where a power or mechanical failure may occur. When such a failure occurs, a controller unit, which is connected to an uninterrupted power supply, provides an electrical control signal to a solenoid valve. The solenoid valve receives a pneumatic input from a pressurized air reservoir. When the electrical signal is received by the solenoid valve, the reserved pneumatic pressure is then released to trigger one or more shut-off valves. A reservoir of rinse water is provided such that when one of the valves is activated by the solenoid, gravity forces rinse water to flow through the valve and into the tank to remove the chemicals from the wafers.

In a preferred embodiment, a first shut-off valve is provided beneath the processing tank which is opened by a solenoid valve. The chemicals stored in the tank will then drain out through the first shut-off valve into either a drain tank or directly into the facility drain. The first shut-off valve will then close and a second shut-off valve will open which will release the reserved rinse water into the processing tank. With this operation, the chemicals in the tank are first drained, then the wafer is rinsed with the reservoir of rinse water.

In an alternate embodiment, both valves are opened simultaneously. The chemicals in the tank will be draining at the same time rinse water is released into the tank. This will allow the wafer to be thoroughly rinsed by the rinse water from the reservoir tank, but would not allow the wafer to soak in the rinse water since the valve to the drain would be open.

BRIEF DESCRIPTION OF THE DRAWINGS

Other objects, features and advantages of the present invention will become apparent upon consideration of the specification and the appended drawings in which.

DETAILED DESCRIPTION OF THE PREFERRED EMBODIMENT

Figure 1:
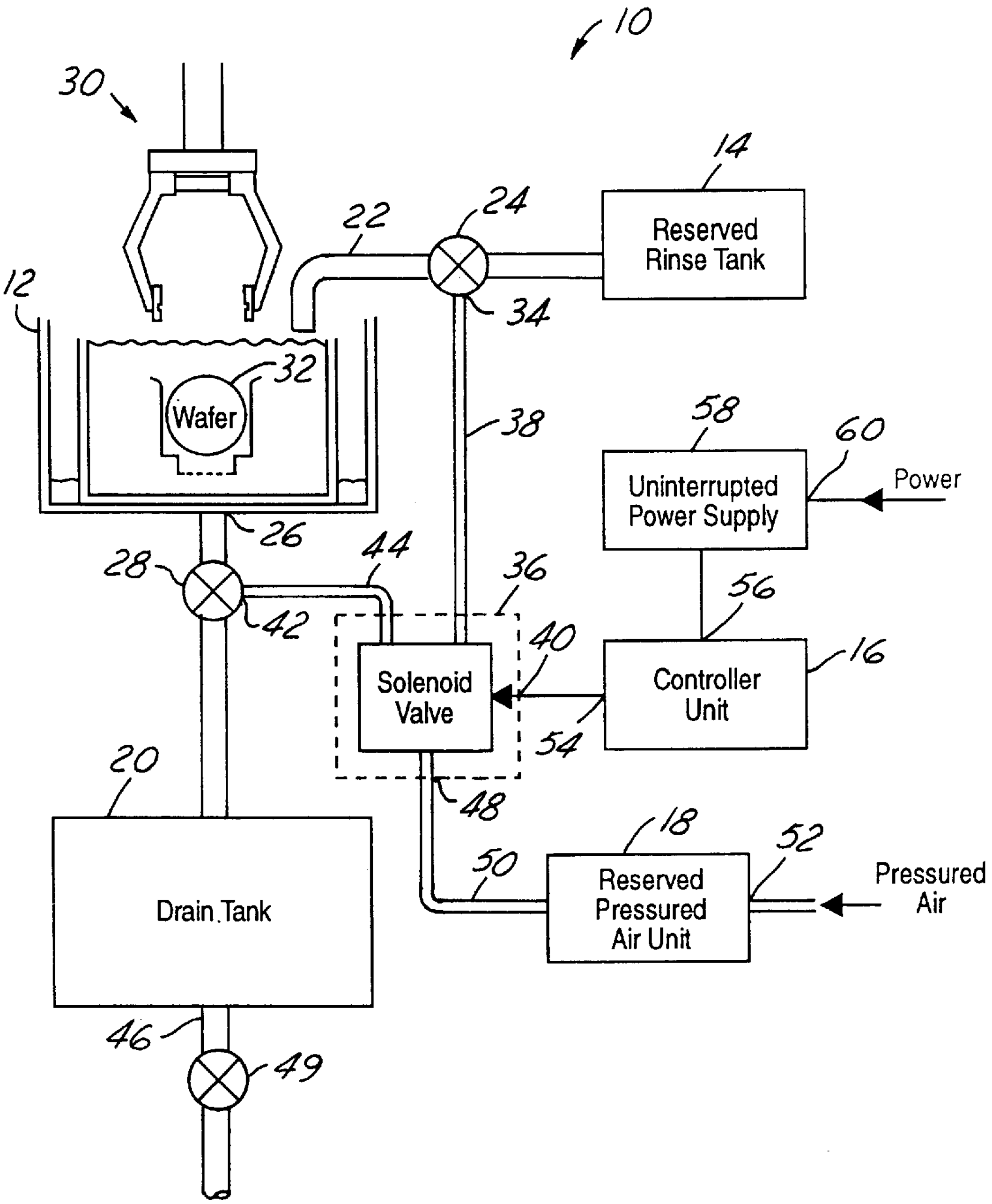
FIG. 1 is a block diagram of the overall implementation of the preferred embodiment of the present invention.

Referring initially to FIG. 1, a wet processing system 10 according to the present invention is shown. The system 10 generally comprises a processing tank 12, a reserved rinse tank 14, a controller unit 16, a reserved pressured air unit 18 and a drain tank 20. The processing tank 12 receives water from the reserved rinse tank 14 through an inlet 22. The processing tank 12 generally receives water or other liquid rinse materials from the reserved rinse tank 14 when a valve 24 is open. It may be desirable that the rinse tank 14 be flushed periodically to prevent bacteria growth. The processing tank 12 has a drain 26 that releases the liquid into the drain tank 20 when valve 28 is open.

The system 10 provides for rapid draining and rinsing the chemicals stored in the processing tank in the event that a mechanical failure or electrical failure occurs. During normal operation, a mechanical arm 30 picks up wafers 32 and remove them from the processing tank 12. The mechanical arm 30 then move the wafers 32 to a separate processing tank (not shown) to continue the next step of the fabrication process. The mechanical arm 30 is generally operated by the electrical power supply received from the manufacturing facility. In the event of a power failure, the mechanical arm 30 will fail to operate. In some applications, the mechanical arm 30 may be operated by pressured air. In the event of an interruption in the pressured air supply, the mechanical arm 30 would also fail to operate. As a result of either the power failure or the pressured air supply failure, the wafers 32 may be subjected to the chemicals stored in the processing tank for an excessive amount of time which may require that the wafers 32 be scrapped. To avoid unnecessarily scrapping the wafers 32, it would be desirable for the valves 24 and 28 to operate automatically to provide draining and rinsing of the chemicals stored in the processing tank when the electrical failure occurs.

The valve 24 has a pneumatic input 34 that is received from a solenoid valve 36 through a pneumatic line 38. When the solenoid valve 36 receives a proper signal at an input 40, the pneumatic line 38 will be pressurized which will then open the valve 24. The details of when the input 40 is received from the controller unit 16 will be described in more detail with respect to FIG. 3.

Similar to the valve 24, the valve 28 has a pneumatic input 42 that is connected to the solenoid valve 36 through a pneumatic line 44. The valve 28 functions similarly to the valve 24 in that when the proper signal is received at the input 40, the pneumatic line 44 will be pressurized which causes the valve 28 to open.

The processing tank 12 drains through the outlet 26 and the valve 28 into the drain tank 20. Since it is desirable when a power failure or mechanical failure occurs to drain the processing tank as quickly as possible, the drain tank 20 is provided to accelerate the draining. The drain tank 20 has an output 46 that is connected through a valve 49 to the general drain of the facility (not shown). The drain tank 20 is provided to avoid any back pressure on the facility drain which would unnecessarily delay the draining of the processing tank 12. Furthermore, more rapid draining of the processing tank 12 may be obtained if the drain tank 20 is maintained in a vacuum (i.e., a negative air pressure). Such a vacuum would allow the drain tank to actually forcibly remove the processing chemicals when the valve 28 is opened. Similarly, the reserve rinse tank may be pressurized to provide a more rapid rinsing of the wafers 32.

The solenoid valve 36 has an input 48 that receives air pressure from the reserved pressured air unit 18 through a pneumatic line 50. The reserved pressured air unit 18 has a pneumatic input 52 that receives pressured air from the facility. During normal operation, the reserved pressured air unit 18 will store the pressurized air up to a certain predetermined pressure. The reserved pressured air unit 18 can be of any type of mechanical tank capable of holding pressurized air. The pneumatic input 52 is generally a one-way valve. Specifically, pressurized air can be received from the facility to pressurize the reserved pressured air unit 18, but air cannot escape from the reserved pressured air unit 18 back to the facility air. As a result, the reserved pressured air unit 18 maintains an adequate amount of air pressure to activate the valves 24 and 28 during an unexpected electrical or mechanical failure. The controller unit 16 has an electrical output 54 that presents an electrical signal to the input 40 of the solenoid valve 36. The electrical signal is presented during predefined conditions to be described in more detail with respect to FIG. 3. The controller unit 16 has a power supply input 56 that receives the electrical power necessary to control the controller unit 16. An uninterrupted power supply 58 provides electrical power to the power supply input 56. The uninterrupted power supply 58 has an input 60 that receives electricity from the facility power grid (not shown). The uninterrupted power supply 58 stores sufficient electricity so that in the event of a power failure, adequate electrical energy can be supplied to operate the controller unit 16.

Figure 2A:
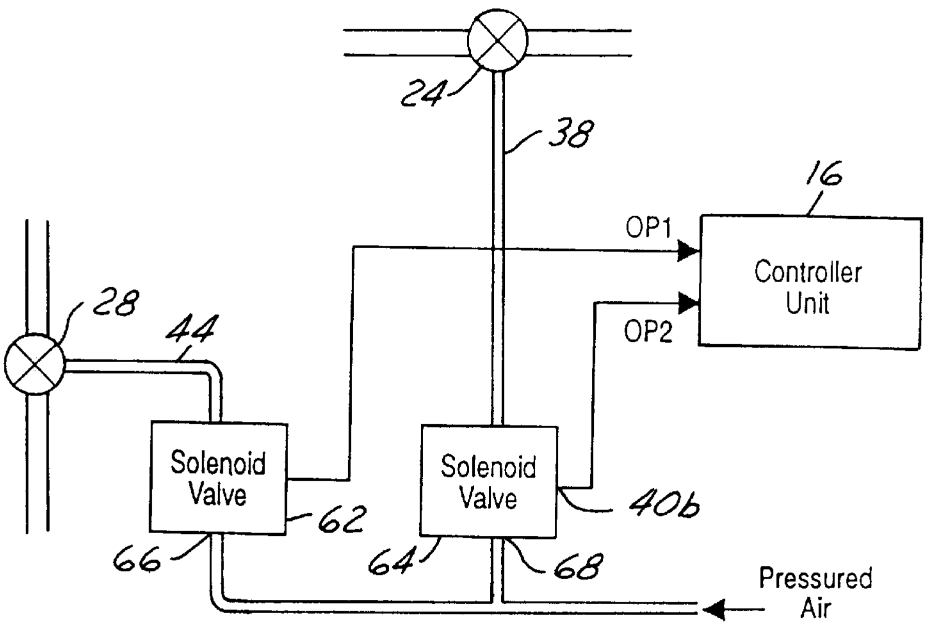
FIG. 2A is a more detailed block diagram of the solenoid of the preferred embodiment of the present invention.
Figure 2B:
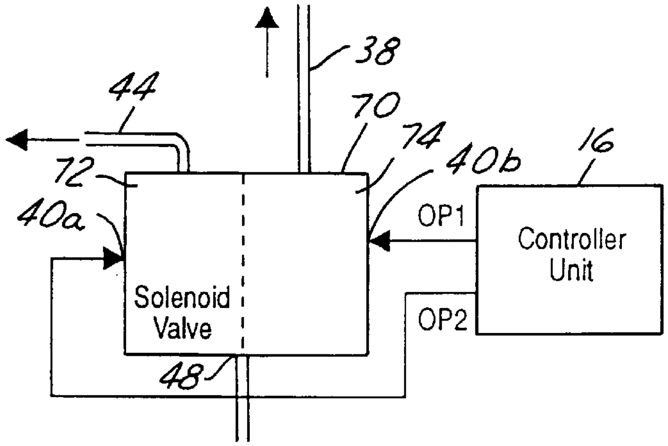
FIG. 2B is an alternate embodiment of the solenoid of the present invention.

Referring to FIG. 2A, the solenoid valve 36 is shown in greater detail. Since the solenoid valve 36 (FIG. 1) needs to operate the valve 24 and the valve 28 (possibly at separate times), a valve element 62 and a valve element 64 are shown. The valve element 62 has a pneumatic input 66 that receives pressurized air from the reserved pressured air unit 18 (FIG. 1). Similarly, the valve element 64 has a pneumatic input 68 that receives pressurized air from the reserved pressured air unit 18 (FIG. 1). The valve element 62 has an input 40*a* that receives an electrical signal from the controller unit 16. Similarly, the valve element 64 has an input 40*b* that receives an electrical signal from the controller unit 16, these are shown in FIG. 2B. In order that the valve element 62 and the valve element 64 may be independently activated and deactivated, independent inputs 40*a* and 40*b* are provided. In an alternative implementation, a single valve element (e.g., valve element 64 or valve element 62) may be used to activate both the shut-off valve 24 and the shut-off valve 28.

Referring to FIG. 2B, the solenoid valve 36 is shown having a single valve element 70. The single valve element 70 has a first chamber 72 and a second chamber 74 that each receive pressurized air from the pneumatic input 48. The first chamber 72 has an input 40*a* while the second chamber 74 has an input 40*b* for receiving electrical signals from the control unit 16. Since the first and second chambers 72 and 74 have separate inputs 40*a* and 40*b*, independent operation of the valves 24 and 28 is realized.

Figure 3:
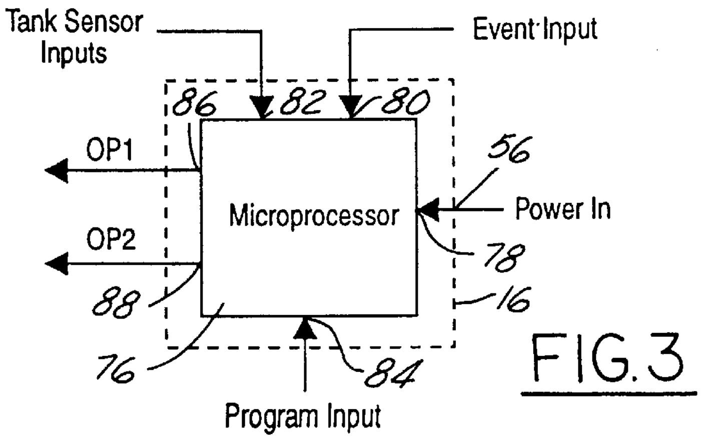
FIG. 3 is a more detailed diagram of the controller unit of the present invention.

Referring now to FIG. 3, the controller unit 16 is shown in greater detail. The controller unit 16 shown in FIG. 3 is one example of an implementation of a control scheme. Other implementations can be utilized without departing from the spirit of the present invention. The controller unit 16 is shown having a microprocessor 76. The microprocessor 76 has an input 78, an input 80, an input 82, an input 84, an output 86 and an output 88. The input 78 receives electrical supply power from the input 56. The electrical supply power is received from the uninterrupted power supply 58 and will be present even in the event of a power supply failure. The input 80 receives an event signal that indicates when a power failure occurs. Various implementations of the event signal received at the input 80 can be implemented to fit the design criteria of a particular application. For example, the input 80 could merely receive a stepped down power signal from the facility power grid. When such a supply voltage is not present, the event is triggered and the microprocessor 76 presents a signal at the outputs 86 and 88 in a particular order to be described later.

The input 82 receives an input from one or more sensors (not shown) positioned in the processing tank 12. The input 82 can be used in a situation where the valve 28 is to remain open until the tank is completely emptied. After which, the valve 28 closes while the valve 24 opens. The sensor input 82 essentially indicates when the processing tank 12 has emptied either completely or to a desired level. The output 86 provides the output signal OP1 that is presented to the input 40*a* of the valve element 62. The output 88 provides a signal OP2 that is presented to the input 40*b* of the valve element 64. The input 84 receives programming input from an external input device (not shown). A plant operator can then provide inputs to the microprocessor 76 to control certain key times. For example, a first time delay can be programmed that indicates the time interval between when the event input 80 receives the indication that a power failure has occurred and when the control signals OP1 and OP2 are presented at the outputs 86 and 88. This first time delay preferably provides an adequate time interval to avoid rinsing the wafers 28 when a mere power surge or short power outage occurs. For example, if the power merely goes off for one second, and then promptly returns, the microprocessor 76 will not drain and rinse the processing tank 12 holding the wafers 28. By providing a programming input, this first time delay can be adjusted to fit the design criteria of a particular application after the manufacturing line is implemented. Specifically, the experience of the plant personnel can be used to program an appropriate first time delay. It should be noted however, that the feature of providing a programmable first time delay can be eliminated if the appropriate plant personnel (such as the plant manager or engineer) determines that adjustments would only hinder the performance of the system 10.

The microprocessor 76 can be adapted to provide an additional output that indicates the time in which the power failure occurred. This would be desirable for determining if the wafers 32 can be used after the drain and rinse procedure.

The system 10 essentially can be configured to operate in several distinct modes. A first mode is an active mode where the valve 28 is opened to first allowing the processing tank 12 to drain through the outlet 26. When the processing tank 12 has emptied completely, one or more sensors (not shown) provide one or more signals at the input 82 which cause the output signal OP1 become inactive and the output signal OP2 to become active. When the output signal OP1 becomes inactive, the valve 28 closes which allows the processing tank to be refilled.

In an alternate active mode, the output signal OP1 is activated which opens the valve 28 and allows the processing tank 12 to empty. When the sensor (not shown) indicates that the tank 12 is empty, the output signal OP2 is activated and the valve 24 opens. When the valve 24 opens, the rinsing material stored in the reserved rinse tank 14 is flushed through the processing tank 12. A predetermined overlap delay is present where both the valve 24 and valve 28 are opened. This predetermined overlap delay allows the chemicals to be washed from the wafer 32 and drained through the outlet 26. After the predetermined overlap delay has expired, the output signal OP1 is deactivated which closes the valve 28. The output signal OP2 remains activated which then allows the valve 24 to remain open for a predetermined time allowing the processing tank 12 to fill up with the rinsing material from the reserved rinse tank 14. By providing the predetermined overlap delay where both valves 24 and 28 are open, the wafers are first washed and then soaked. The predetermined overlap delay can be programmed into the microprocessor 76 through the programming input 84. This will allow the system 10 to be adjusted after implementation in the wafer processing plant.

It should be noted that each of the events that have been described as being implemented by the microprocessor 76 may be implemented using discrete components (such as resistor/capacitor delay networks), logic gates one shot delays, or any other means to implement predetermined delays. The microprocessor 76 is one example of implementing such predetermined delays that provides flexible programming at the programming input 84.

The system 10 can also operate in a static mode. In the static mode, the output signal OP1 is activated when the event input is received, this opens the valve 28 which allows the tank 12 to empty. After a predetermined time (to be determined when designing the processing tank 12 and the outlet 26), the output signal OP1 will be deactivated causing the valve 28 to close. Immediately after the signal OP1 is deactivated, the output signal OP2 is activated. This causes the valve 24 to open allowing the rinse water stored in the reserved rinse tank 14 to flow into the processing tank 12 through the inlet 22. While the static mode does not allow for the rinsing of the wafer prior to the soaking of the wafer, it can be programmed to provide acceptable results in a manufacturing environment.

While the present invention has been described in connection with providing safeguards in case of mechanical or power failures, it should be understood that the present invention may be used to implement standard functions. Specifically, the present invention may be used as a means to drain chemicals from the processing tank 12 as part of a standard operating procedure. The new chemicals could be added to the processing tank 12 from a chemical inlet that may be provided separate from the inlet 22.

While the present invention has been described at an illustrative manner, it should be understood that the terminology used is intended to be in the nature of words of description rather than of limitation.

Furthermore, while the present invention has been described in terms of a preferred embodiment thereof, it is to be appreciated that those skilled in the art will readily apply these teachings to other possible variations of the invention. For instance, the reserved rinse tank 14 previously described (FIG. 1) may not be necessary. A reserved rinse line may be used in its place as long as an adequate flow rate of a rinse fluid can be obtained from such line. Furthermore, the solenoid valve 36 and the reserved pressured air unit 18 (FIG. 1) may also be replaced by an energy storage device such as a storage battery, as long as the valves 24 and 28 (FIG. 1) can be operated by motorized means. The controller unit 16 (FIG. 1) would then send signal 40 directly to the energy storage device.

The embodiment of the invention in which an exclusive property or privilege is claimed are defined as follows:

We claim:

1. A wafer processing apparatus comprising:

a processing tank capable of storing processing fluids;

a rinse fluid source for supplying rinse fluid to said processing tank; an actuating means for providing at least one control signals in response to one or more electrical control signals;

a first shut-off valve responding to said at least one control signals, said first shut-off valve being connected between said rinse fluid source and said processing tank; and a second shut-off valve connected to said processing tank, said second shut-off valve for draining said processing tank in response to said at least one control signals.

2. An apparatus according to claim 1, wherein said actuating means comprises a reserved pressured air unit and a solenoid valve for providing a mechanism to open said first and second shut-off valves.

3. An apparatus according to claim 1, wherein said actuating means comprising an energy storage device and a motorized means for operating said first and second shut-off valves.

4. An apparatus according to claim 1, further comprising:

a controller unit for supplying said at least one electrical control signals to said actuating means, said at least one control signals for determining an order of opening and closing said first and second shut-off valves.

5. An apparatus according to claim 4, wherein said controller unit receives power from an uninterrupted power supply.

6. The apparatus according to claim 4, wherein a first one of said electrical control signals controls the opening and closing of said first shut-off valve and a second one of said electrical control signals controls the opening and closing of said second shut-off valve.

7. The apparatus according to claim 6, wherein a first delay time is present between a time when said second valve opens and a time when said first valve opens.

8. The apparatus according to claim 6, wherein said first and second control signals are provided after a second time delay.

9. The apparatus according to claim 1, wherein said rinse fluid source comprises a reserved rinse fluid tank.

10. The apparatus according to claim 8, wherein said second time delay is programmable.

11. The apparatus according to claim 4, wherein said controller unit comprises a microprocessor capable of providing an indication of the time at which said apparatus is activated.

12. The apparatus according to claim 4, further comprising a drain tank for receiving the processing chemicals from the processing tank when said second shut-off valve is open.

13. The apparatus according to claim 12, wherein:

said drain tank is provided in a lower than atmospheric pressure state; and said reserved rinse tank is provided in a pressurized state.

14. The apparatus according to claim 2, wherein said first and second shut-off valves each comprise:

a first input for receiving a pneumatic pressure;

an output for presenting a pneumatic pressure; and an actuating input for receiving one of said control signals for actuating the opening of said solenoid actuated valve.

15. The apparatus according to claim 1, wherein said first and second shut-off valves are pneumatically actuated.

16. A wafer processing apparatus equipped with a rapid drain and rinse system for use in wet processing silicon wafers comprising:

a processing tank capable of storing processing fluids;

a reserved rinse tank for storing rinse fluid, said reserved tank being connected to and positioned above said processing tank;

a solenoid actuated valve for providing at least one pneumatic control signals in response to at least one electrical control signals;

a first shut-off valve connected between said reserved rinse tank and said processing tank, said first shut-off valve being pneumatically actuated by one of said pneumatic control signals;

a second shut-off valve connected to a bottom portion of said processing tank, said second shut-off valve being pneumatically actuated by one of said pneumatic control signals to release said processing fluids;

a reserved pressured air unit connected to said solenoid actuated valve for providing pressure used to provide said pneumatic control signals;

a controller unit for supplying said at least one electrical control signals to said solenoid actuated valve, said at least one electrical control signals for determining an order of opening and closing said first and second shut-off valves, said control unit being powered by an uninterrupted power supply; and a drain tank for receiving the processing fluids from the processing tank when said second valve is open.

17. A method for providing a drain and rinse system for use in wet bench processing of wafers comprising the steps of:

(a) exposing wafers to processing fluids stored in a processing tank;

(b) storing rinse fluid in a reserved rinse fluid tank;

(c) draining said processing tank of said processing fluids by opening a first shut-off valve; and (d) rinsing said wafers in said processing tank by emptying said reserved rinse fluid tank into said processing tank.

18. The method according to claim 17, wherein said step of draining said processing tank occurs after: (I) a power failure occurs, and (ii) a time delay.

19. The method according to claim 17, wherein step (d) occurs after step (c) has completely drained said processing tank.

20. The method according to claim 17, wherein step (c) and step (d) occur simultaneously.

* * * * *